United States Patent [19]

Burke et al.

[11] 4,183,034
[45] Jan. 8, 1980

[54] PIN PHOTODIODE AND INTEGRATED CIRCUIT INCLUDING SAME

[75] Inventors: Richard G. Burke, Raleigh; James S. Kolodzey, Chapel Hill, both of N.C.

[73] Assignee: International Business Machines Corp., Armonk, N.Y.

[21] Appl. No.: 896,872

[22] Filed: Apr. 17, 1978

[51] Int. Cl.$^2$ ............................................. H01L 27/14
[52] U.S. Cl. ........................................ 357/30; 357/58; 357/40; 357/19
[58] Field of Search ................... 357/30, 58, 40, 19

[56] References Cited

U.S. PATENT DOCUMENTS

| 3,304,430 | 2/1967 | Biard | 250/217 |
| 3,366,793 | 1/1968 | Svedberg | 250/211 |
| 3,423,594 | 1/1969 | Golopin | 250/211 |
| 3,535,532 | 10/1970 | Merryman | 250/217 |
| 3,959,646 | 5/1976 | deCremoux | 250/211 J |

OTHER PUBLICATIONS

Melchior et al., *Proceedings of the IEEE*, vol. 58, No. 10, Oct. 1970, pp. 1466-1486.
Mathur et al., International Electron Device Meeting, (abstract), Wash., D.C. Oct. 1968.

*Primary Examiner*—Martin H. Edlow
*Attorney, Agent, or Firm*—John B. Frisone

[57] ABSTRACT

A PIN photodiode structure uses direct side entry into the I region, thus permitting the use of thicker P and N regions with a comparatively thin I region without sacrificing speed and results in more constant spatial distribution upon carrier generation and longer wave length devices with conventional speeds or smaller devices at faster speeds, and may be integrated on the same chip with associated circuits.

10 Claims, 7 Drawing Figures

QUANTUM EFFICIENCY (ELECTRONS PER INCIDENT PHOTON)

ELECTRON TRANSIT TIME (NANOSECONDS)

PIN PHOTODIODE AND INTEGRATED CIRCUIT INCLUDING SAME

DESCRIPTION

Technical Field

This invention relates to photodiode light detectors and more particularly to a novel PIN photodiode light detector which employs a novel construction and side entry to achieve a substantial improvement in performance.

BACKGROUND ART

Fiber optic communications generally employ a modulated light source, such as a light emitting diode (LED), a photodiode (PD) light detector and a glass or plastic fiber interconnecting the LED and PD. In most instances, the LED is modulated by a two-level digital signal and emits one of two light intensities depending on which of the digital signals is applied to the LED. The PD responds to the light intensity conducted by the fiber and provides an electric signal output corresponding thereto, thus, reproducing in a usable electric format the information modulated onto the LED at some remote location.

At this time PN and PIN photodiodes are available. Neither of the prior art structures is entirely suitable since neither can be easily integrated with the receiver circuit in a two-dimensional monolithic chip. A common PIN photodiode available in the prior art is illustrated in FIG. 1. This planar arrangement, in addition to its difficulty with integration, has other substantial limitations and drawbacks.

The PIN photodiode of FIG. 1 is built on a silicon chip 10 which has an I region 11, a thin P region 12, and an N region 13. A ring-like anode 14 is in contact with the thin P region 12 and a silicon oxide layer 15. An aluminum cathode 16 is deposited on the planar surface of the N region 13.

Incident light, for example, light exiting a transmission fiber, passes through the thin P region and is detected by absorption in the I region. However, some of the light passes through, especially at the longer wave lengths due to the limited thickness of the I region in the vertical direction as viewed in the drawing. This dimension must be limited in order to maintain speed since the generated carriers have to travel through the longer distances if this dimension is extended to increase response (see FIG. 4 which shows the effect on transit time with variation of I region thickness. The response curve shown in FIG. 2 illustrates a drop in response above 800 nm caused by the finite vertical dimension of the I region. The graph in FIG. 3 shows the efficiency as a function of I region thickness and wave length, again graphically illustrating the inherent constraints placed on operation by the structure of FIG. 1.

Side entry PIN photodiodes have received little attention and are not at this time commercially available. Optimum structure and characteristcs of this type photodiode have not been considered but are part of the subject matter of this invention and are discussed below.

In addition to the above region thickness tradeoffs, the thin P layer region required to pass the photo energy is electrically undesirable since its thinness increases the resistivity of the device.

The invention contemplates a novel PIN photodiode comprising a semiconductor chip having a thick planar P region separated from a planar N region by a thin planar I region provided with means for admitting photo energy directly to the I region in a direction parallel to the planar orientation of the I region and electric conducting means contacting the P and N regions for connecting the PIN photodiode to electronic circuits formed on the same or other semiconductor chip.

BRIEF DESCRIPTION OF DRAWINGS

In the accompanying drawings forming a material part of this disclosure:

In FIG. 5 a semiconductor chip 20 has formed therein planar P and N regions as illustrated with a comparatively thin intervening I region. Both the P and N regions may be made as thick as required since no photo energy is passed therethrough. The I region in a vertical direction may be made quite thin since light from the glass fiber 21 enters the I region in the direction of its plane. This dimension can be made as long as required to obtain the desired response without affecting the speed of the device since the carriers formed by absorption travel in the direction perpendicular to the plane which direction is unaffected by an increase in the plane direction. Electrodes 22 and 23 are deposited on the P and N regions for connection to electronic circuits which may be formed on the same chip as illustrated in FIG. 6. The entire structure can be supported on a suitable substrate 24.

In FIG. 6 a semiconductor chip 30 mounted on a substrate 31 includes a PIN photodiode formed therein. The diode includes an anode 32 deposited on a thick P region 33, a thin I region 34 which receives photo energy from an optical fiber 35 which is cemented to the substrate 31 and a thicker N region 36 which has a cathode 37 deposited thereon.

Figure 7:
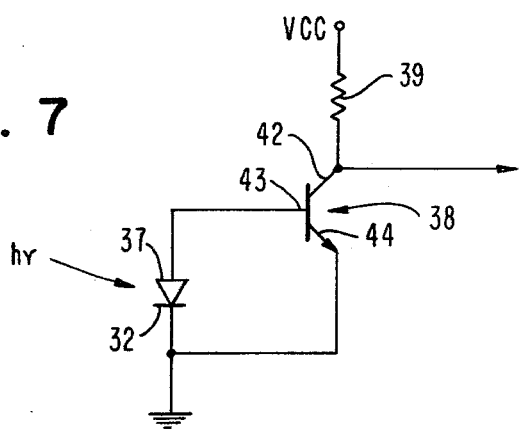
FIG. 7 is a schematic electrical diagram of the device illustrated in FIG. 6.

As an example of additional circuitry, the chip 30 includes an NPN transistor 38 and a resistor 39 formed by an N region 40 within a P region 41. The transistor 38 includes an N diffused collector 42, a P diffused base 43 and an N diffused emitter 44 interconnected as illustrated in FIG. 7. It should be noted that processes other than diffusion may be utilized to fabricate the structure described above.

Figure 1:
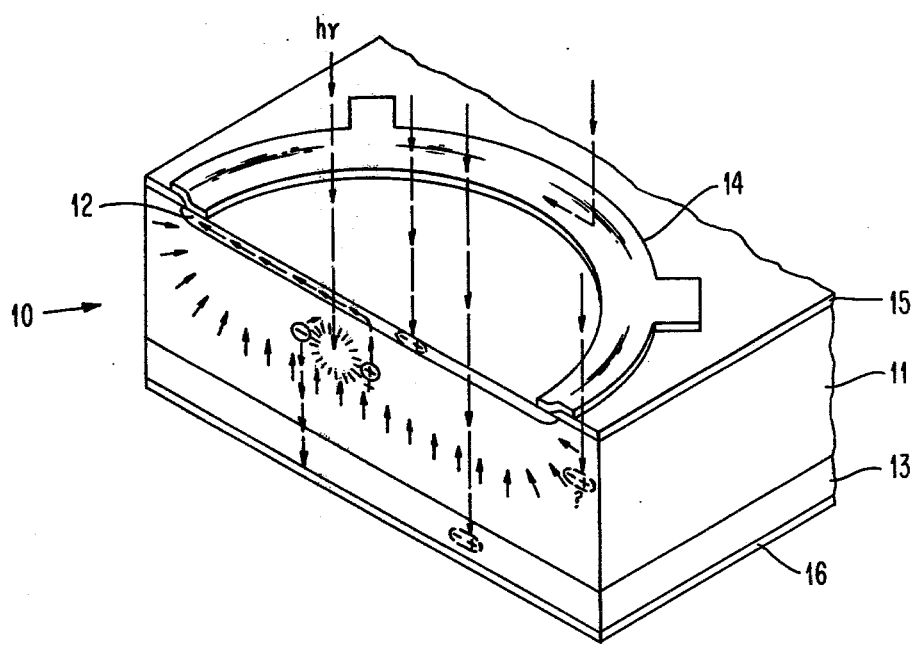
FIG. 1 is a schematic diagram of a prior art PIN photodiode.
Figure 2:
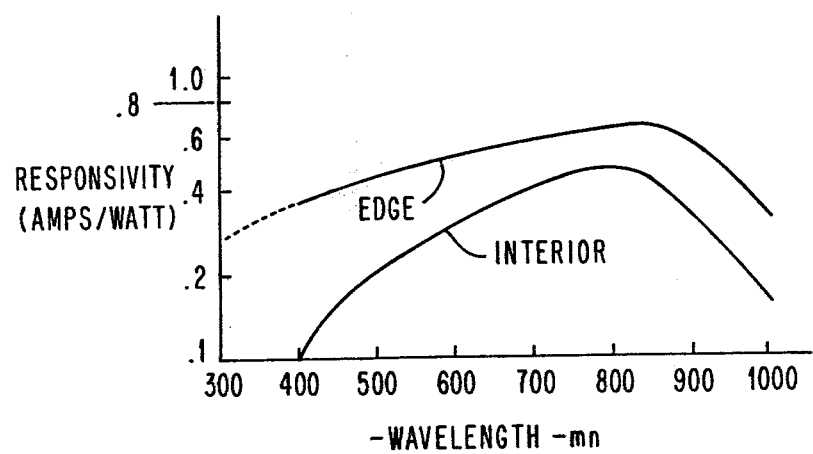
FIGS. 2, 3 and 4 are graphs illustrating the operating characteristics of the device illustrated in FIG. 1.
Figure 3:
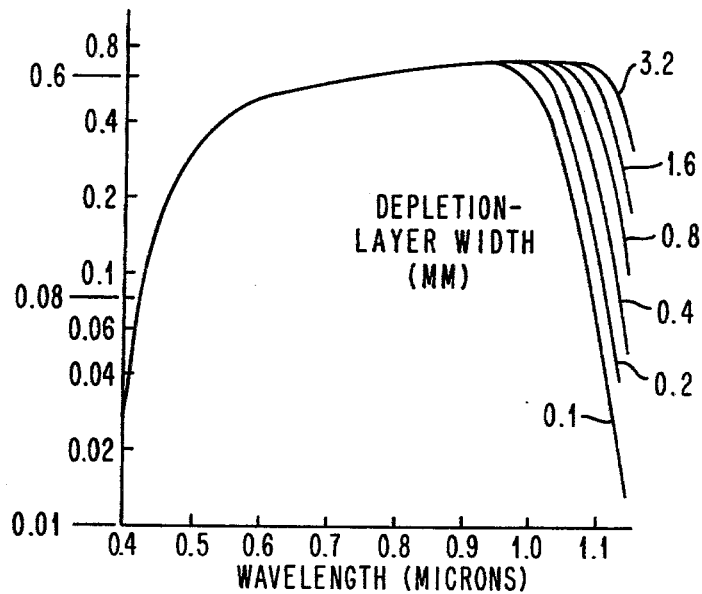
Figure 4:
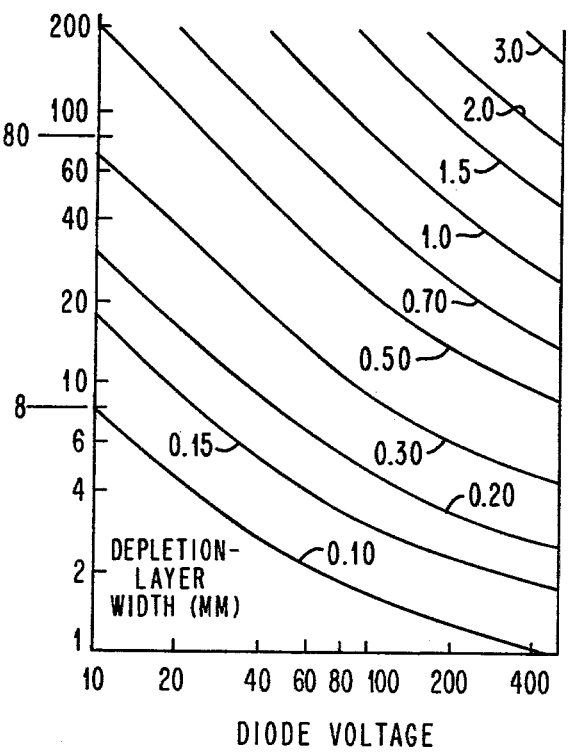
Figure 5:
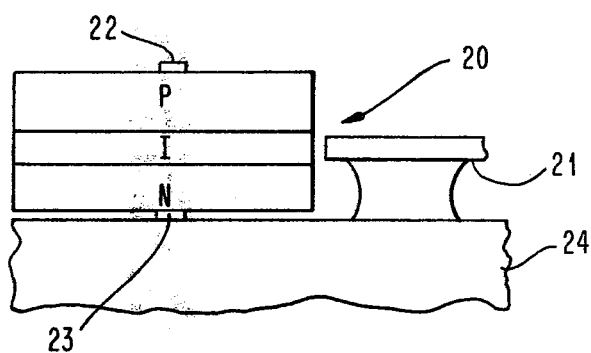
FIG. 5 is a schematic diagram of a PIN photodiode constructed in accordance with the invention.
Figure 6:
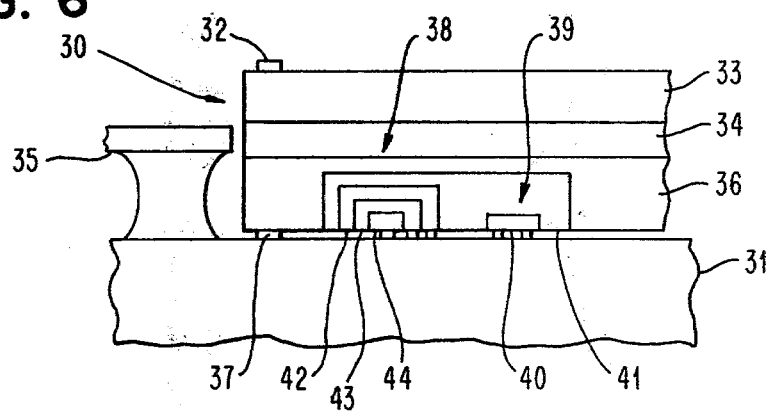
FIG. 6 is a schematic diagram of a PIN photodiode according to the invention and associated electronic circuits constructed on the same semiconductor chip.

The schematic electric diagram of FIG. 7 is identical to the circuit formed on chip 30 of FIG. 6 and is included to more clearly illustrate the operation of the circuits built on chip 30 of FIG. 6. The resistor 39 is connected to a voltage supply VCC and the emitter to ground. The anode 37 of the PIN diode is connected to the base 43 of transistor 38 and the cathode 32 to ground. Transistor 38 amplifies the signal provided by the PIN photodiode. In a similar manner additional circuits can be added to the chip 30 as required.

While the invention has been particularly shown and described with reference to preferred embodiments thereof, it will be understood by those skilled in the art that various changes in form and details may be made therein without departing from the spirit and scope of the invention.

Having thus described our invention, what we claim as new, and desire to secure by Letters Patent is:

1. A PIN photodiode comprising: a semiconductor chip having at least two surfaces and edge surfaces extending therebetween, said chip having a P region extending from one surface inwardly, an N region extending from said other surface inwardly and a substantially uniform thin I region, having a substantial extent in at least one direction so as to provide increased responsivity to a broad range of wave lengths of photo energy, separating said P and N regions and extending to at least one of said edge surfaces whereby photoenergy may enter the I region along said at least one direction directly without passing through the other regions, an anode electrode in contact with said P region surface, and a cathode electrode in contact with said N region surface said P and N regions in a direction normal to said at least two surfaces are substantial in extent and greater than the I region.

2. A PIN photodiode as set forth in claim 1 wherein said I region extends in the said at least two surface direction a substantial distance for absorbing the longer light wave lengths and extends in the direction perpendicular to said surfaces a distance to enhance the speed of the PIN photodiode.

3. A PIN photodiode as set forth in claim 1 further including a substrate for supporting said chip and means for admitting photo energy directly to said I region.

4. A PIN photodiode as set forth in claim 3 wherein said means for admitting photo energy directly to said I region is a light conducting fiber adapted for connection to a source of photo energy.

5. A PIN photodiode as set forth in any one of claims 1, 2–4 in which said semiconductor chip is made of silicon.

6. A monolithic chip including a PIN photodiode and circuit means operatively interconnected therewith comprising: a semiconductor chip having at least two bounded surfaces and edge surfaces extending therebetween, said chip having a P region extending from a portion of one surface inwardly, an N region extending from a portion of the said other surface inwardly, an I region of substantially uniform thickness separating said P and N regions and extending to at least one of said edge surfaces whereby photo energy may enter the I region directly without passing through the other regions, and at least one other device formed into said chip for operative operation with said PIN photodiode, and conductive means interconnecting said PIN diode and said at least one other device formed into said chip said P and N regions in a direction normal to said bounded surfaces are substantial in extent and greater than the I region.

7. A monolithic chip as set forth in claim 6 wherein said I region extends in the bounded surfaces direction a substantial distance for absorbing the longer light wave lengths and extends in the direction perpendicular to said surfaces a distance to enhance the speed of the PIN photodiode.

8. A monolithic chip as set forth in claim 6 further including a substrate for supporting said chip and means for admitting photo energy directly to said I region.

9. A monolithic chip as set forth in claim 8 wherein said means for admitting photo energy directly to said I region is a light conducting fiber adapted for connection to a source of photo energy.

10. A monolithic chip as set forth in any one of claims 6, 7–9 in which said semiconductor chip is made of silicon.

* * * * *